United States Patent
Yamagata

(10) Patent No.: US 7,892,887 B2
(45) Date of Patent: Feb. 22, 2011

(54) SEMICONDUCTOR DEVICE AND FABRICATION METHOD THEREOF

(75) Inventor: Osamu Yamagata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/656,621

(22) Filed: Feb. 4, 2010

(65) Prior Publication Data

US 2010/0144092 A1 Jun. 10, 2010

Related U.S. Application Data

(60) Continuation of application No. 12/007,072, filed on Jan. 7, 2008, which is a division of application No. 11/524,957, filed on Sep. 22, 2006, now Pat. No. 7,429,793.

(30) Foreign Application Priority Data

Oct. 5, 2005 (JP) .......................... P2005-292417

(51) Int. Cl.
  H01L 21/66 (2006.01)
  H01L 21/00 (2006.01)
  H01L 21/50 (2006.01)
  H01L 21/48 (2006.01)
  H01L 21/44 (2006.01)
  H01L 21/4763 (2006.01)

(52) U.S. Cl. .................. 438/108; 438/15; 438/25; 438/51; 438/55; 438/64; 438/67; 438/106; 438/613; 438/637; 257/E21.499; 257/E21.5; 257/E21.503; 257/E21.51; 257/E21.511

(58) Field of Classification Search .......... 257/E21.499, 257/E21.5, E21.503, E21.51, E21.511, E21.513
See application file for complete search history.

(56) References Cited

U.S. PATENT DOCUMENTS 4,112,308 A * 9/1978 Olschewski et al. ......... 250/551
5,045,142 A * 9/1991 Drake et al. ................ 156/278

(Continued)

FOREIGN PATENT DOCUMENTS

JP 10-223832 8/1998

(Continued)

OTHER PUBLICATIONS

Japanese Office Action issued Oct. 28, 2008 for corresponding Japanese Application No. 2005-292471.

*Primary Examiner*—Charles D Garber
*Assistant Examiner*—Mohsen Ahmadi
(74) *Attorney, Agent, or Firm*—Rader, Fishman & Grauer PLLC

(57) ABSTRACT

A semiconductor device and a fabrication method thereof are provided. A semiconductor device which is packaged as it includes a semiconductor in which an electronic circuit is disposed, the semiconductor device including: a substrate; a semiconductor chip which has a semiconductor main body having the electronic circuit formed thereon, a pad electrode formed on the semiconductor main body and a projected electrode that is connected to the pad electrode and projected from a surface of the semiconductor main body, wherein the semiconductor chip is mounted on the substrate from the back side of the surface to form the projected electrode thereon; and an insulating layer which is formed as the semiconductor chip buried therein and is polished from a top surface of the insulating layer to a height at which a top of the projected electrode is exposed.

14 Claims, 13 Drawing Sheets

U.S. PATENT DOCUMENTS

| | | | |
|---|---|---|---|
| 5,497,033 | A | 3/1996 | Fillion et al. |
| 6,153,448 | A * | 11/2000 | Takahashi et al. ............ 438/114 |
| 6,696,317 | B1 * | 2/2004 | Honda ......................... 438/108 |
| 7,064,440 | B2 | 6/2006 | Jobetto et al. |
| 7,193,301 | B2 | 3/2007 | Yamaguchi |
| 7,279,750 | B2 | 10/2007 | Jobetto |
| 2001/0038151 | A1 | 11/2001 | Takahashi et al. |
| 2002/0195718 | A1 | 12/2002 | Imasu et al. |
| 2003/0205796 | A1 * | 11/2003 | Hakey et al. ................. 257/678 |
| 2004/0089941 | A1 | 5/2004 | Mamitsu et al. |
| 2004/0242003 | A1 | 12/2004 | Murayama |
| 2005/0073055 | A1 | 4/2005 | Pan et al. |
| 2006/0163722 | A1 | 7/2006 | Hsu |

FOREIGN PATENT DOCUMENTS

| | | |
|---|---|---|
| JP | 11-097616 | 4/1999 |
| JP | 2005-175319 | 6/2005 |
| JP | 2005-175320 | 6/2005 |
| JP | 2005-175402 | 6/2005 |

\* cited by examiner

SEMICONDUCTOR DEVICE AND FABRICATION METHOD THEREOF

CROSS REFERENCES TO RELATED APPLICATIONS

The present application is a continuation of application Ser. No. 12/007,072, filed on Jan. 7, 2008, the entirety of which being incorporated herein by reference; which is a divisional of application Ser. No. 11/524,957, filed on Sep. 22, 2006, now U.S. Pat. No. 7,429,793, the entirety of which being incorporated herein by reference. The present application claims priority based on Japanese Patent Application No. 2005-292417, filed on Oct. 5, 2005, the entirety of which being incorporated herein by reference.

BACKGROUND OF THE INVENTION

1. Field of the Invention

The present invention relates to a semiconductor device and a fabrication method thereof, particularly to a semiconductor device and a fabrication method thereof in a form called System in Package (SiP) in which chips are packaged at the wafer level.

2. Description of the Related Art

There is an increasing demand for the realization of small-sized, low-profile, and light-weight portable electronics appliances such as a digital video camera, a digital cellular telephone, or a notebook personal computer. In order to respond to this demand, in one hand, 70% of reduction is realized in miniaturization of semiconductor devices such as recent VLSI. On the other hand, for an electronic circuit device in which such semiconductor devices are mounted on a printed wiring board, study and development have been conducted for, as an important challenge, how the packaging density of components on a substrate (printed wiring board) is improved.

For example, for the packaging form of the semiconductor device, the form is shifted from the lead insertion type such as DIP (Dual Inline Package) to the surface mounting type. Moreover, flip chip mounting is developed in which a bump (projected electrode) formed of solder or gold is disposed on a pad electrode of a semiconductor chip and the chip is connected to a wiring board through the bump as it is placed face down.

Moreover, now a package in a complex form is being developed which is called System in Package (SiP) in which in an insulating layer which insulates a rewiring layer formed on a semiconductor substrate (chip), a semiconductor chip having electronic circuits including an active device therein and passive devices such as a capacitance device and a coil are buried for packaging at the wafer level.

The configuration and the fabrication method of SiP are disclosed in Patent References 1 to 3, for example.

For a fabrication method of the wafer level SiP in which the semiconductor chip having the active device is buried in the insulating layer, for example, a semiconductor chip is mounted on a substrate, the semiconductor chip is buried with a photosensitive resin by spin coating or printing to form an insulating layer, the acquired insulating layer is patterned by exposure and development to form an opening for a pad electrode of the semiconductor chip, a conductive layer is buried in the opening by plating, and then a rewiring layer is formed.

In the fabrication method of SiP, in the process step of forming the insulating layer formed of the resin having the semiconductor chip buried therein, a high viscous resin is necessary in order to form an insulating layer having a thickness of 50 μm or greater. The film thickness made by a single spin coating is limited to 100 μm at the maximum. For example, when an insulating layer is formed thick in association with a semiconductor chip having a thickness of a few 100 μm, it is necessary that the layer is temporarily dried for every single coating to prevent the first coating from being dissolved in the process step for the second coating to secure the film thickness.

After the process step of burying the thick semiconductor chip with the resin insulating layer as described above, in the process step of exposure for patterning to form an opening for the pad electrode of the semiconductor chip, it is necessary to increase the amount of exposure depending on the film thickness of the resin insulating film to be exposed. Consequently, an increase in the amount of exposure causes a crush to a pattern, and it becomes difficult to conduct stable patterning.

Particularly, when a plurality of semiconductor chips having differences in the thickness is buried in a common resin insulating layer, the depth to the pad electrodes of the semiconductor chips differs. Thus, there is a problem that the focal depth differs in exposure and openings may not be formed in high resolution as the focus is adjusted to two pad electrodes. Therefore, by the method before, only semiconductor chips having the same thickness can be mounted.

Patent Reference 1: JP-A-2005-175402
Patent Reference 2: JP-A-2005-175320
Patent Reference 3: JP-A-2005-175319

SUMMARY OF THE INVENTION

It is desirable to provide a semiconductor device and a fabrication method thereof, in which a pad electrode of a semiconductor chip to be buried in an insulating film is connectable to an upper wiring layer on a fine wiring in a semiconductor device of a SiP form in which the semiconductor chip is buried in the insulating film.

A semiconductor device according to an embodiment of the invention is a semiconductor device which is packaged as it includes a semiconductor in which an electronic circuit is disposed, the semiconductor device including: a substrate; a semiconductor chip which has a semiconductor main body having the electronic circuit formed thereon, a pad electrode formed on the semiconductor main body and a projected electrode that is connected to the pad electrode and projected from a surface of the semiconductor main body, wherein the semiconductor chip is mounted on the substrate from the back side of the surface to form the projected electrode thereon; and an insulating layer which is formed as the semiconductor chip is buried therein and which is polished from a top surface of the insulating layer to a height at which a top of the projected electrode is exposed.

The semiconductor device according to an embodiment of the invention is the semiconductor device which is packaged as it includes the semiconductor in which the electronic circuit is disposed, the device in which the semiconductor chip which has the semiconductor main body having the electronic circuit formed thereon, the pad electrode formed on the semiconductor main body and the projected electrode that is connected to the pad electrode and projected from the surface of the semiconductor main body, wherein the semiconductor chip is mounted on the substrate from the back side of the surface to form the projected electrode thereon, and the insulating layer is formed as the semiconductor chip buried therein and which is polished from the top surface of the insulating layer to the height at which the top of the projected electrode is exposed.

In addition, a fabrication method of a semiconductor device according to an embodiment of the invention is a fabrication method of a semiconductor device which is packaged as it includes a semiconductor in which an electronic circuit is disposed, the fabrication method including the steps of: mounting on the substrate a semiconductor chip which has a semiconductor main body having the electronic circuit formed thereon, a pad electrode formed on the semiconductor main body and a projected electrode that is connected to the pad electrode and projected from a surface of the semiconductor main body, wherein the semiconductor chip is mounted on the substrate from the back side of the surface to form the projected electrode thereon; forming an insulating layer as the semiconductor chip is buried therein; and polishing the insulating layer from a top surface of the insulating layer to a height at which a top of the projected electrode is exposed.

The fabrication method of the semiconductor device according to an embodiment of the invention is the fabrication method of the semiconductor device which is packaged as it includes the semiconductor in which an electronic circuit is disposed. First, the semiconductor chip is mounted on the substrate. The semiconductor chip has the semiconductor main body having the electronic circuit formed thereon, the pad electrode formed on the semiconductor main body and the projected electrode that is connected to the pad electrode and projected from the surface of the semiconductor main body. The semiconductor chip is mounted from the back side of the surface to form the projected electrode thereon.

Subsequently, the semiconductor chip is buried to form the insulating layer. Moreover, the insulating layer is polished from the top surface to the height at which the top of the projected electrode is exposed.

The semiconductor device according to an embodiment of the invention is configured in which the insulating layer to bury the semiconductor chip therein is polished to expose the projected electrode in the semiconductor device of the SiP form in which the semiconductor chip is buried in the insulating film. In the device, the pad electrode of the semiconductor chip can be made fine not by the photolithography process step and connected to the upper wiring layer.

The fabrication method of the semiconductor device according to an embodiment of the invention is the method in which the insulating layer to bury the semiconductor chip therein is polished to expose the projected electrode in the fabrication method of the semiconductor device of the SiP form. By the method, the pad electrode of the semiconductor chip can be made fine not by the photolithography process step and connected to the upper wiring layer.

DETAILED DESCRIPTION OF THE INVENTION

Hereinafter, embodiments of a semiconductor device and a fabrication method thereof according to an embodiment of the invention will be described with reference to the drawings.

First Embodiment

Figure 1:
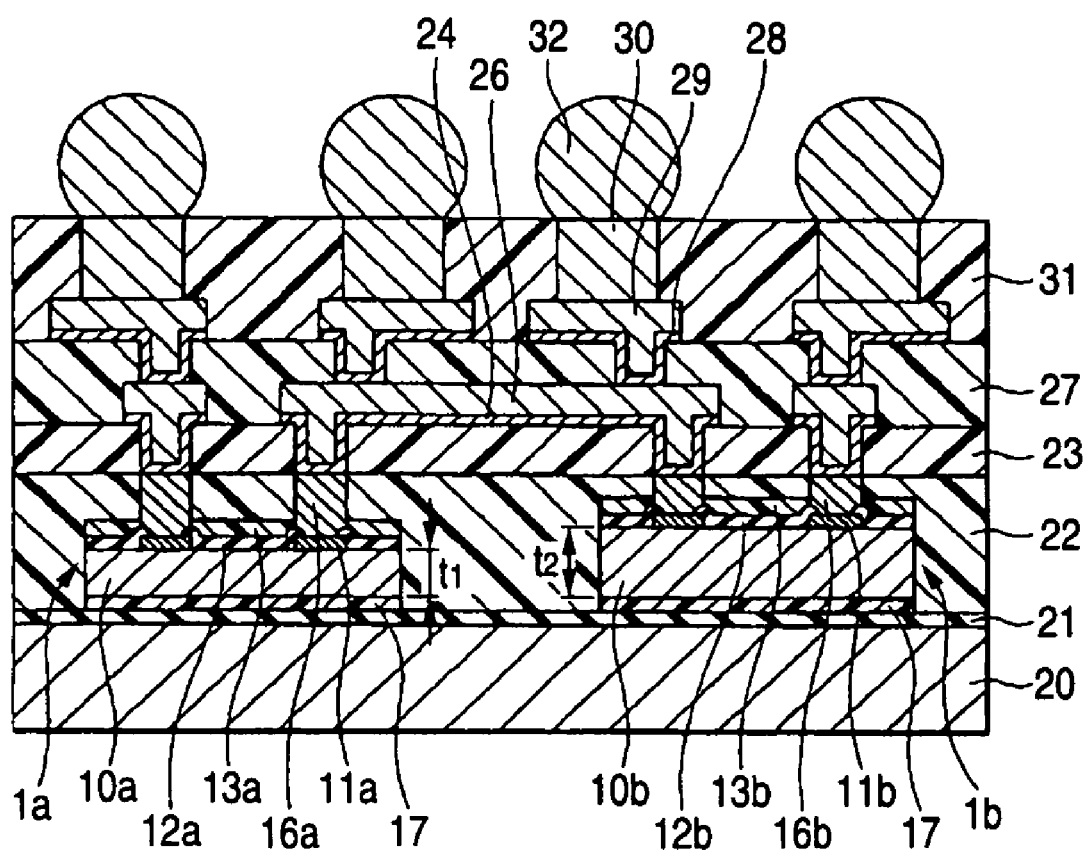
FIG. 1 shows a schematic cross section depicting a semiconductor device according to a first embodiment of the invention.

FIG. 1 shows a schematic cross section depicting a semiconductor device according to the embodiment.

For example, on a semiconductor substrate 20 formed of silicon, an insulating film 21 of silicon oxide is formed. Above it, two semiconductor chips (1a and 1b), for example, are mounted with a die attach film 17, the semiconductor chips formed of silicon on which an electronic circuit is formed including an active device such as a transistor.

In the semiconductor chips (1a and 1b), pad electrodes (11a and 11b) are formed on the surfaces of semiconductor main bodies (10a and 10b) on which an electronic circuit, for example, is formed, and protective insulating films (12a and 12b) are formed so as to make openings for the pad electrodes (11a and 11b). Above the protective insulating films (12a and 12b), resin insulating films (13a and 13b) are formed to make openings for the pad electrodes (11a and 11b) in the same pattern as the pattern of the protective insulating films (12a and 12b). In the openings formed in the protective insulating films (12a and 12b) and the resin insulating films (13a and 13b), bumps (projected electrodes 16a and 16b) are formed at a predetermined height which are connected to the pad electrodes (11a and 11b). Here, in reality, on the interface between the pad electrodes (11a and 11b) and the projected electrodes (16a and 16b), a seed layer is formed which makes bumps (16a and 16b). However, the seed layer is omitted in the drawing for simplicity.

For example, the thicknesses ($t_1$ and $t_2$) of the semiconductor main bodies (10a and 10b) of the two semiconductor chips (1a and 1b) are varied from each other. For example, $t_1$ and $t_2$ are a few 100 μm each, and the difference is within 100 μm, for example.

For example, a first insulating layer 22 is formed of a non-photosensitive insulating resin so as to bury the semiconductor chips (1a and 1b). The first insulating layer 22 is polished from the top surface to the height at which the tops of the bumps (16a and 16b) of the semiconductor chips (1a and 1b) are exposed.

Here, as described above, the thicknesses ($t_1$ and $t_2$) of the semiconductor main bodies (10a and 10b) of the two semiconductor chips (1a and 1b) are varied from each other. The bumps (16a and 16b) are formed in such a way that the total sum of the heights of the thicknesses ($t_1$ and $t_2$) and the bumps (16a and 16b) are nearly equal among a plurality of the semiconductor chips (1a and 1b) having different thicknesses ($t_1$ and $t_2$) of the semiconductor main bodies (10a and 10b). For example, the bumps (16a and 16b) is formed so as to have the diameter of 100 μm, the height of 100 μm at the maximum, and the aspect ratio is 1.0 or below.

Above the first insulating layer 22 in which the tops of the bumps (16a and 16b) are exposed in the surface thereof, a second insulating layer 23 is formed which is formed of a photosensitive resin and in which the openings are formed through which the tops of the bumps (16a and 16b) are exposed.

In the openings of the second insulating layer 23 and above the second insulating layer 23, a first wiring is formed as it is connected to the bumps (16a and 16b), the first wiring is formed of a seed layer 24 and a copper layer 26.

Above the second insulating layer 23, a third insulating layer 27 is formed as it covers the first wiring. In the third insulating layer 27, an opening is formed which reaches the first wiring.

In the opening of the third insulating 27 and above the third insulating layer 27, a second wiring is formed which is connected to the first wiring and formed of a seed layer 28 and a copper layer 29.

Above the insulating layer having the second insulating layer 23 laminated with the third insulating layer 27, a conductive post 30 is formed which is connected to the second wiring.

In addition, around the conductive post 30, an insulating buffer layer 31 is formed which is formed on the insulating layer having the second insulating layer 23 laminated with the third insulating layer 27 and relaxes the stress that is generated when the semiconductor device is mounted on the substrate.

Moreover, a bump (projected electrode) 32 is formed which is connected to the conductive post 30 as it is projected from the surface of the buffer layer 31.

As described above, the second insulating layer 23 is laminated with the third insulating layer 27 and the buffer layer 31 to from the upper insulating layer. The upper wiring layer such as the first wiring, the second wiring and the conductive post is formed as buried in the upper insulating layer so as to connect to the bumps (16a and 16b) of the semiconductor chips (1a and 1b).

The semiconductor device according to the embodiment is configured in which the insulating layer to bury the semiconductor chip therein is polished to expose the bump (the projected electrode) in the SiP semiconductor device in which the semiconductor chip is buried in the insulating film, and is a semiconductor device which makes the pad electrode of the semiconductor chip fine not by the photolithography process step and can connect it to the upper wiring layer.

The first and second wirings or a part of the wiring further laminated can configure passive devices such as a capacitance device and an inductance. For example, these passive devices are combined to configure LPF (Low Pass Filter), BPF (Band Pass Filter) or HPF (High Pass Filter), for example. In addition, these are combined with the active device disposed on the electronic circuit to configure a so-called SiP semiconductor device.

Next, a fabrication method of the semiconductor device according to the embodiment will be described.

Figure 2A:
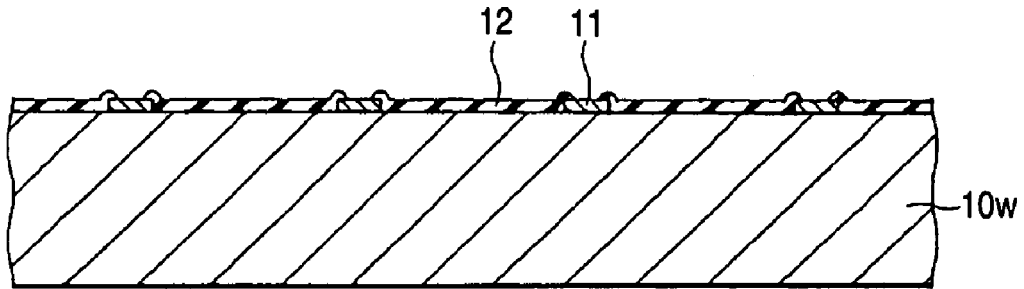
FIGS. 2A to 2C show cross sections depicting the fabrication process steps of a fabrication method of the semiconductor device according to the first embodiment of the invention.

First, as shown in FIG. 2A, for example, on a semiconductor wafer 10w having a diameter of ϕ200 mm and a thickness of 0.725 mm, an electronic circuit including an active device such as a transistor is formed. Openings for the pad electrode 11 and the pad electrode 11 connected to the electronic circuit are formed, and then the protective insulating film 12 is formed as it covers the electronic circuit.

Figure 2B:
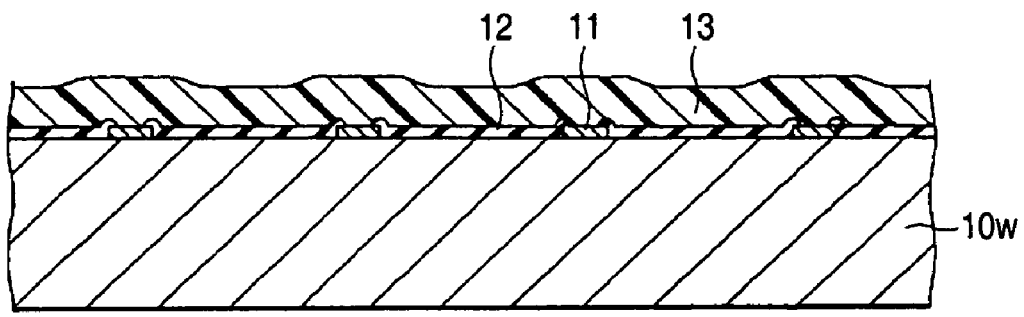

Subsequently, as shown in FIG. 2B, a photosensitive resin such as polyimides, phenols, epoxies is coated in a film thickness of about 10 μm by spin coating to form the resin insulating layer 13. For example, when a photosensitive polyimide is formed by spin coating, it is formed for a time period of (1000 rpm for 30 seconds)+(2000 rpm for 40 seconds)+(1000 rpm, 10 seconds)+(1500 for 10 seconds), and heat treatment is conducted as a prebake process for a time period of (90° C. for 120 seconds)+(100° C. for seconds).

Figure 2C:
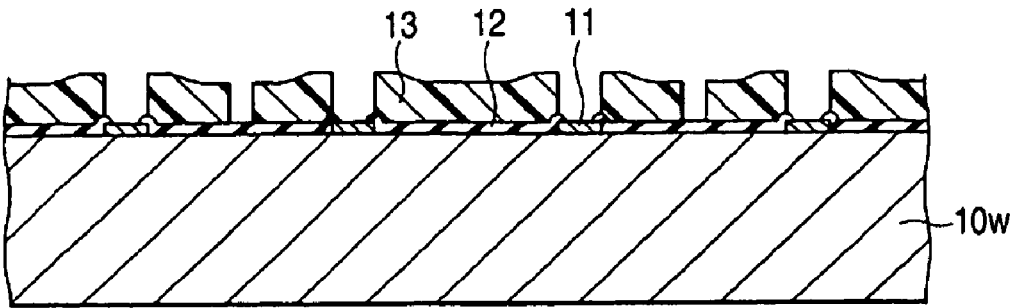

Subsequently, as shown in FIG. 2C for example, exposure and development are conducted in the pattern to form the opening for the pad electrode 11 and to form the opening through which the pad electrode 11 is exposed in the resin insulating layer 13. For example, this exposure is conducted in the amount of exposure as 125 mJ/cm$^2$.

After the resin insulating layer 13 is patterned, the resin insulating layer 13 is cured.

Figure 3A:
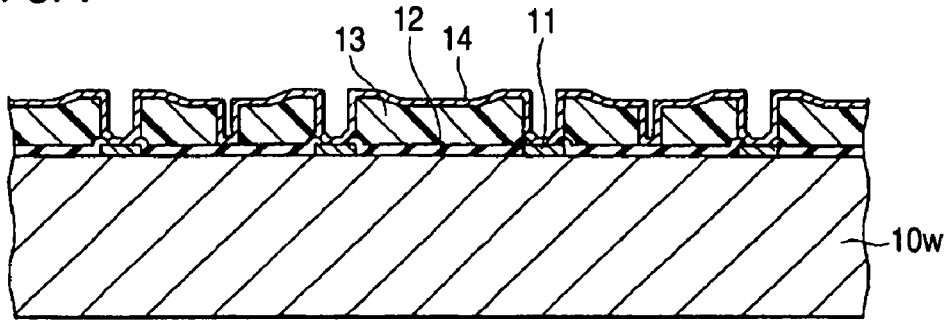
FIGS. 3A to 3C show cross sections depicting the fabrication process steps of the fabrication method of the semiconductor device according to the first embodiment of the invention.

Subsequently, as shown in FIG. 3A, the inner wall surfaces of the openings formed in the resin insulating layer 13 are covered by sputtering. For example, films are deposited in such a way that Ti is in a film thickness of 600 nm and then Cu is in a film thickness of 600 nm, and a seed layer 14 is formed for an electrolytic plating process in the subsequent process step.

Figure 3B:
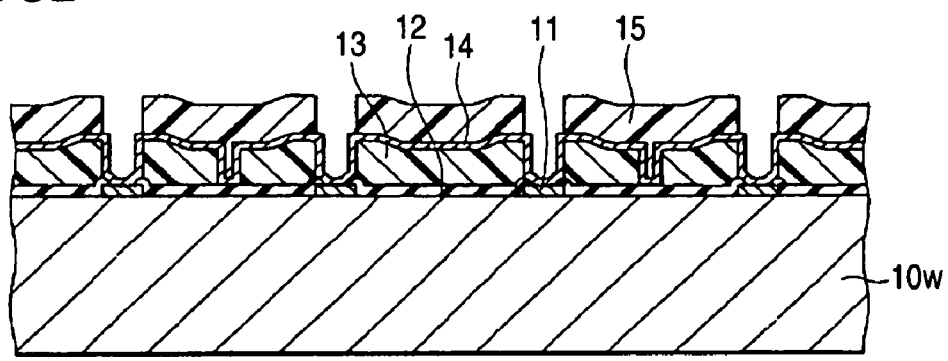

Subsequently, as shown in FIG. 3B, for example, by a photolithography process step, a resist film 15 is formed in the pattern to open openings for the openings and the bump forming area formed in the resin insulating layer 13.

Figure 3C:
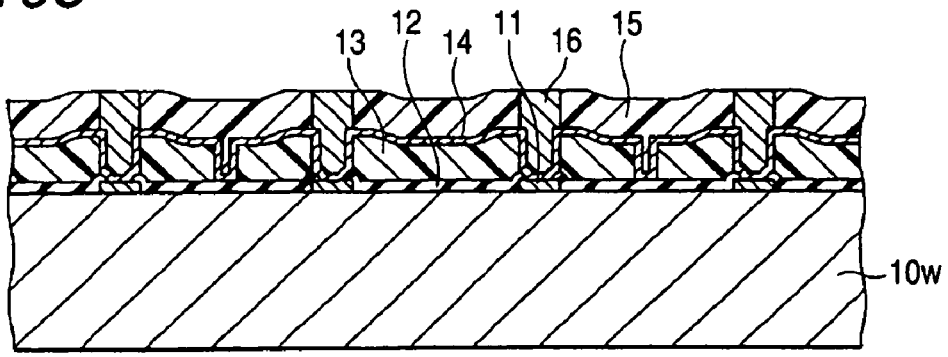

Subsequently, as shown in FIG. 3C for example, by the electrolytic plating process in which the seed layer 14 is one of the electrodes, copper is deposited over the area except the area of forming the resist film 15, and a bump 16 is formed. For example, the copper plating process has a condition as 1.5 ASD (A/dm.sup.2). For example, the bump 16 is formed to have a diameter of 100 μm, a height of 100 μm at the maximum, and an aspect ratio of 1.0 or below.

Figure 4A:
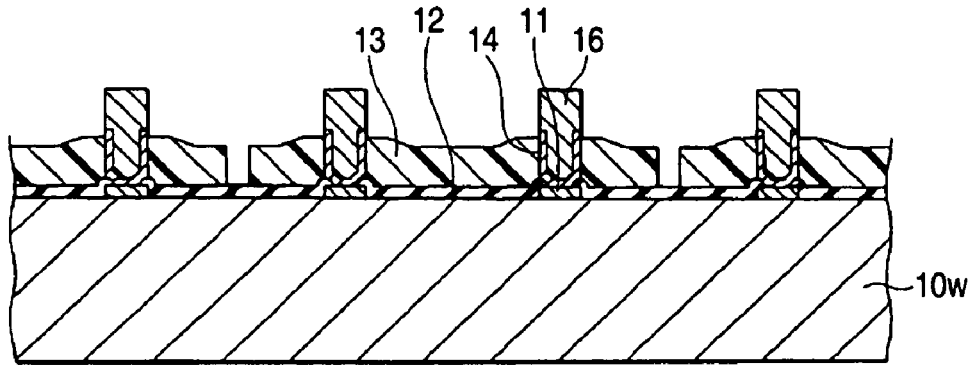
FIGS. 4A to 4C show cross sections depicting the fabrication process steps of the fabrication method of the semiconductor device according to the first embodiment of the invention.

Subsequently, as shown in FIG. 4A, the resist film 15 is removed by a solvent, for example, and the bump 16 is used as a mask for wet etching to remove the seed layer 14 between the bumps 16.

Figure 4B:
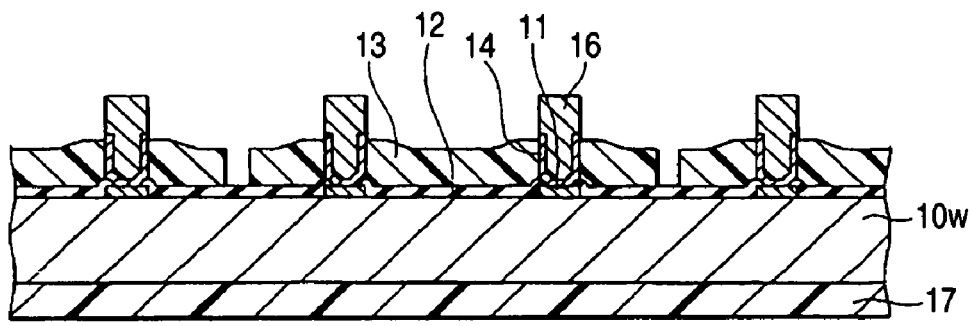

Subsequently, as shown in FIG. 4B, the back side of the semiconductor wafer 10 is ground by a #2000 wheel until the thickness of the semiconductor wafer 10w reaches about a few 100 μm, for example, as necessary.

Moreover, for example, the die attach film 17 is laminated and attached to the back side of the semiconductor wafer 10w.

For example, the lamination condition is a rate of 1 m/min, a pressure of 10 N/cm, and a temperature of 65° C.

Figure 4C:
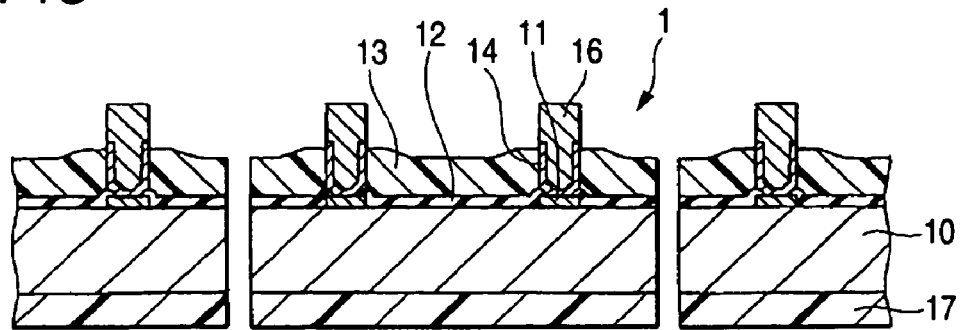

Subsequently, as shown in FIG. 4C, the semiconductor wafer 10w is diced to form the semiconductor chips 1 in a predetermined shape. For example, the dicing condition is the number of revolutions of a spindle of 4000 rpm, and a feed rate of 10 mm/sec.

As described above, the semiconductor chip is formed which is built in the semiconductor device according to the embodiment. The thickness of the resulted semiconductor chip is about a few 100 µm as described above.

As described above, a plurality of types of semiconductor chips is fabricated.

Figure 5A:
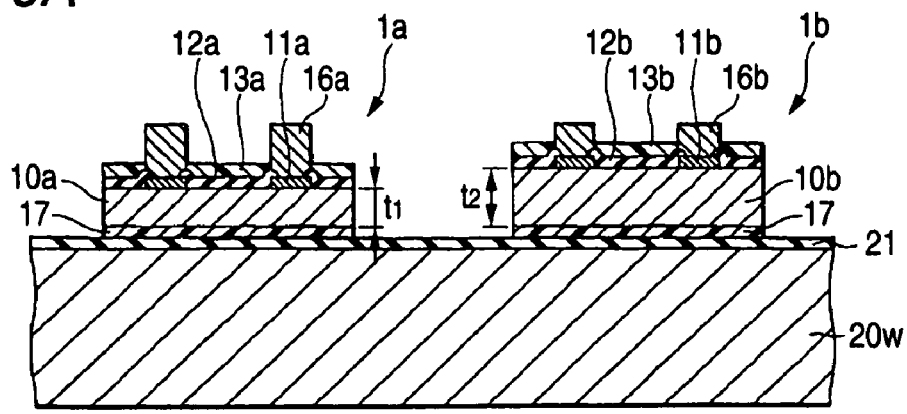
FIGS. 5A to 5C show cross sections depicting the fabrication process steps of the fabrication method of the semiconductor device according to the first embodiment of the invention.

Subsequently, as shown in FIG. 5A, on a substrate 20w in the form of the wafer on the surface of which the insulating film 21 such as silicon oxide is formed, an alignment mark preformed on the substrate 20w is recognized to mount the two semiconductor chips (1a and 1b) having different thicknesses thus formed face up by thermocompression bonding with the die attach film 17. For example, the thermocompression bonding condition is a load of 1.6 N, a temperature of 160° C., and a time period for two seconds.

In the configuration of the two semiconductor chips (1a and 1b), the pad electrodes (11a and 11b) are formed on the surfaces of the semiconductor main bodies (10a and 10b). The protective insulating films (12a and 12b) are formed so as to form the openings for the pad electrodes (11a and 11b). Above the protective insulating films (12a and 12b), the resin insulating films (13a and 13b) are formed in which the openings for the pad electrodes (11a and 11b) are formed in the same pattern as that of the protective insulating films (12a and 12b). The bumps (projected electrodes 16a and 16b) are formed at a predetermined height in the openings which are formed in the protective insulating films (12a and 12b) and the resin insulating films (13a and 13b), the bumps being connected to the pad electrodes (11a and 11b). In addition, the seed layer is omitted in the drawing which is formed on the interface between the pad electrodes (11a and 11b) and the projected electrodes (16a and 16b).

The thicknesses ($t_1$ and $t_2$) of the semiconductor main bodies (10a and 10b) of the semiconductor chips (1a and 1b) are about 400 µm, or about 725 µm, for example, and $t_1$ and $t_2$ are each set to have a few 100 µm, $t_1$ and $t_2$ are varied from each other, but the difference is within 100 µm, for example.

Figure 5B:
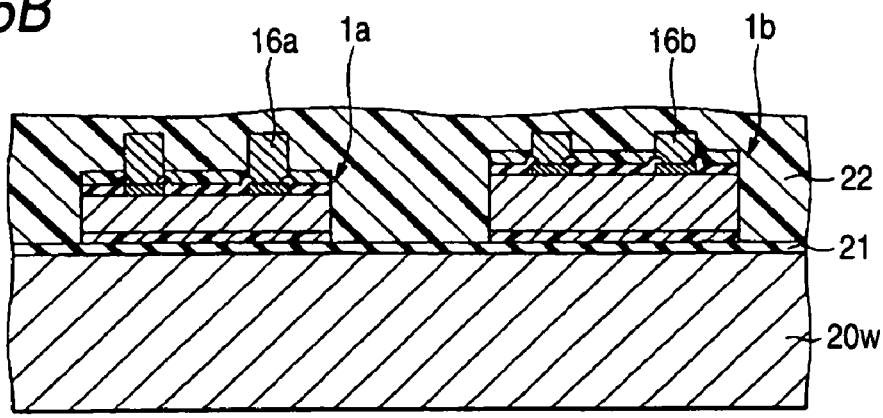

Subsequently, as shown in FIG. 5B, for example, a non-photosensitive resin material such as epoxies, acrylics, phenols, and polyimides is coated throughout the surface of the semiconductor chips (1a and 1b) by printing or molding to form the first insulating layer 22.

Figure 5C:
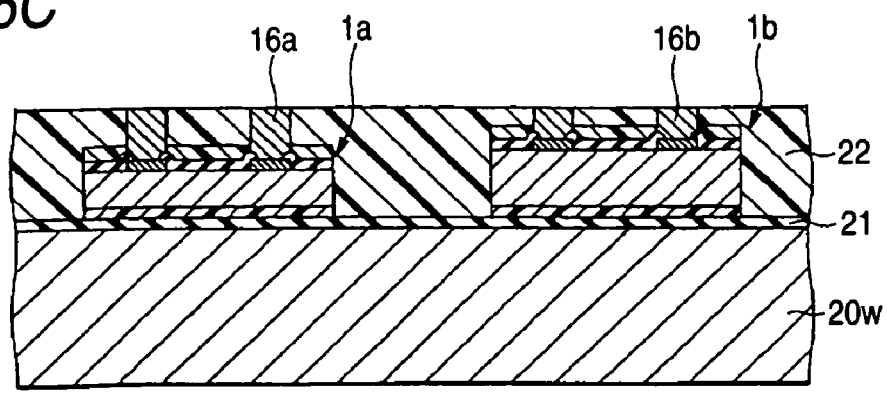

Subsequently, as shown in FIG. 5C, the first insulating layer 22 is polished from the top surface until the tops of the bumps (16a and 16b) are exposed, for example.

For example, the polishing condition is the number of revolutions of a spindle of 3500 rpm with a #600 wheel.

As described above, even though the thicknesses ($t_1$ and $t_2$) of the semiconductor chips (1a and 1b) are varied, both chips have the bumps of a height of 100 µm thereon. The first insulating layer 22 is polished so as to expose the bumps (16a and 16b) of the semiconductor chips (1a and 1b), whereby the chips are processed in such a way that the total heights of the thickness and the bump are nearly equal among a plurality of the semiconductor chips. As described above, the height of the bump is utilized to absorb the difference between the thicknesses of the semiconductor chips (1a and 1b), and the heights can be made equal at the tops of the bumps.

As described above, in the case in which the thickness of a semiconductor chip is 400 µm or above, the film of the photosensitive material cannot be formed at a single coating when the chip is buried with the photosensitive material by spin coating as before. However, since the first insulating film is thus polished to expose the bump, it is unnecessary to use a photosensitive material. A resin can be selected which is able to form the insulating layer 22 by a single coating, and conductivity can be secured.

Figure 6A:
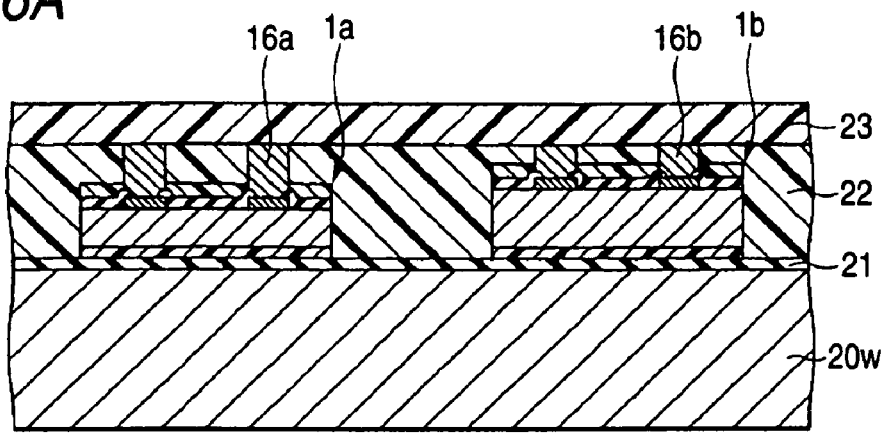
FIGS. 6A to 6C show cross sections depicting the fabrication process steps of the fabrication method of the semiconductor device according to the first embodiment of the invention.

Subsequently, as shown in FIG. 6A, a photosensitive resin such as polyimides, phenols and epoxies is coated by spin coating to form the second insulating layer 23.

For example, when a photosensitive polyimide is formed in a film thickness of 78 µm by spin coating, it is formed under the coating condition of a time period of (7000 rpm for 25 seconds)+(1000 rpm for 125 seconds)+(1000 rpm for 10 seconds)+(1500 rpm for 10 seconds), and heat treatment is conducted as prebake for a time period of (60 C for 240 seconds)+(90° C. for 240 seconds)+(110° C. for 120 seconds).

Figure 6B:
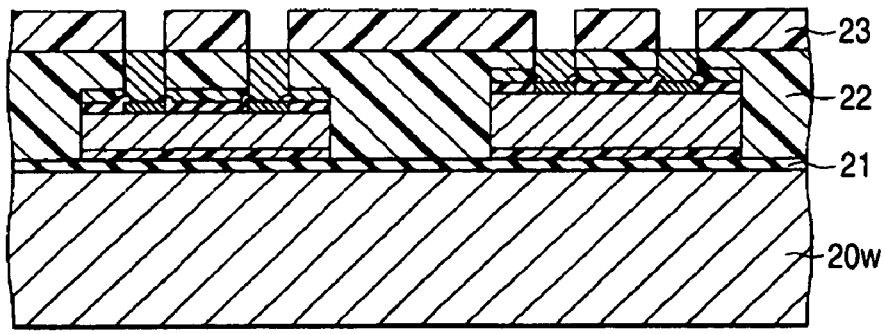

Subsequently, as shown in FIG. 6B, for example, exposure and development are conducted to form openings in the second insulating layer 23 for the bumps (16a and 16b) of the semiconductor chips (16a and 16b). In addition, the openings may be formed in the area in which an inductor and the others are formed. For example, this exposure is conducted at the amount of exposure as 300 mJ/cm$^2$.

After the second insulating layer 23 is patterned, the second insulating layer 23 is cured.

Figure 6C:
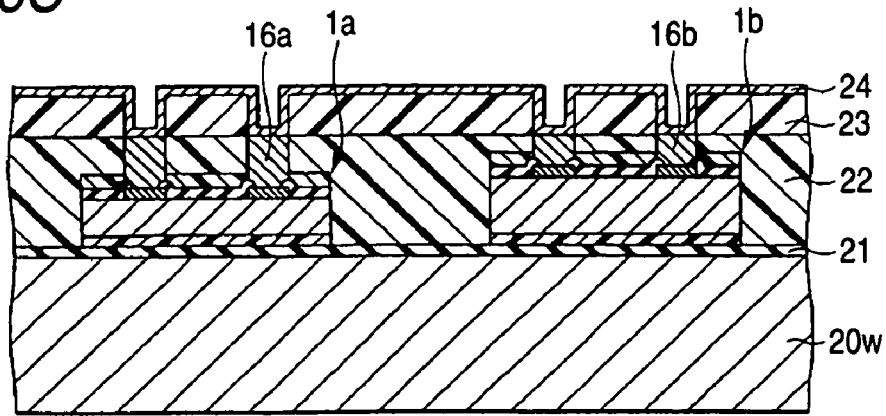

Subsequently, as shown in FIG. 6C, the inner wall surfaces of the openings formed in the first insulating layer 22 are covered by sputtering, for example, films are deposited in such a way that Ti is in the film thickness of 160 nm and then Cu is in the film thickness 600 nm, for example, and the seed layer 24 is formed for an electrolytic plating process in the subsequent process step.

Figure 7A:
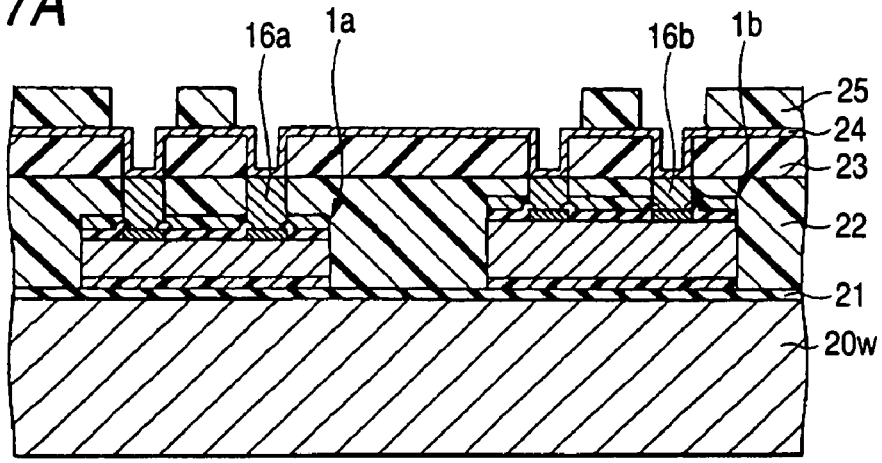
FIGS. 7A to 7C show cross sections depicting the fabrication process steps of the fabrication method of the semiconductor device according to the first embodiment of the invention.

Subsequently, as shown in FIG. 7A, for example, by a photolithography process step, a resist film 25 is formed in the pattern to form openings and the first wiring forming area formed in the first insulating layer 23.

Figure 7B:
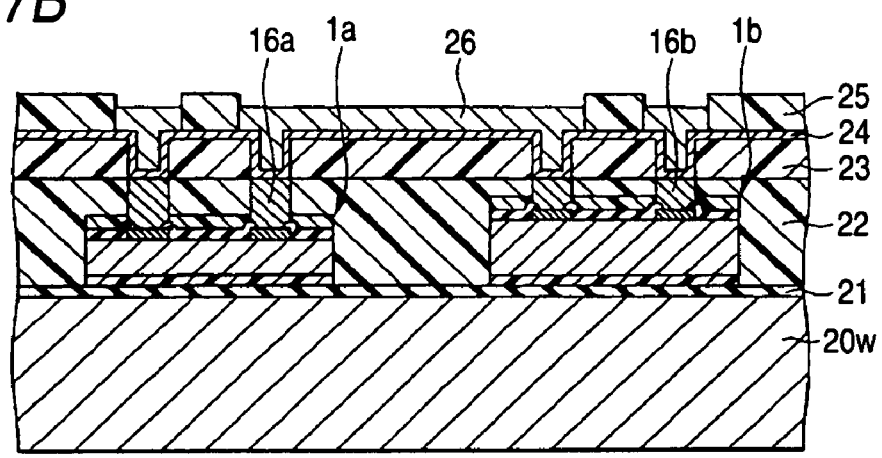

Subsequently, as shown in FIG. 7B, for example, by an electrolytic plating process in which the seed layer 24 is one of electrodes, copper is deposited over the area except the area of forming the resist film 25, and a copper layer 26 is formed in a predetermined wiring circuit pattern. For example, the plating condition is a current density of 400 mA/50 min.

Figure 7C:
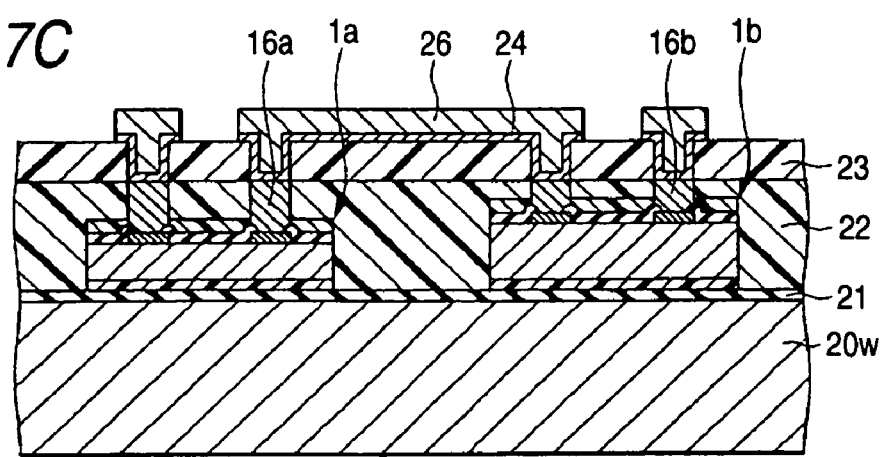

Subsequently, as shown in FIG. 7C, the resist film 25 is removed by a solvent, for example. Moreover, the copper layer 26 is used as a mask for wet etching to remove the seed layer 24 between the copper layers 26.

Thus, the first wiring is formed which is formed of the seed layer 24 and the copper layer 26.

Figure 8A:
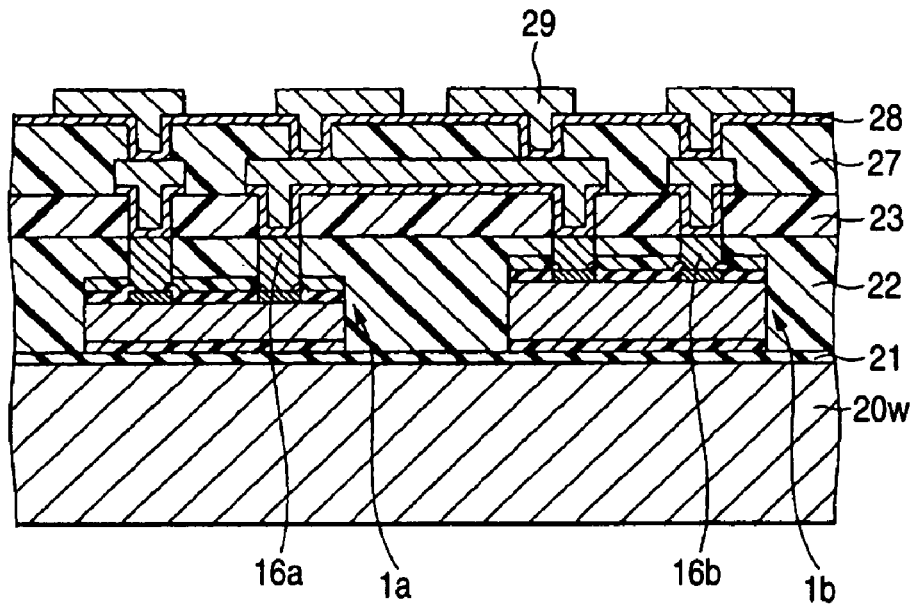
FIGS. 8A and 8B show cross sections depicting the fabrication process-steps of the fabrication method of the semiconductor device according to the first embodiment of the invention.

Subsequently, the same process steps are repeated as those described above, as shown in FIG. 8A, the second wiring is laminated which is formed of the third insulating layer 27, the seed layer 28 and the copper layer 29.

Here, first, the first wiring is covered to form the third insulating layer 27 above the second insulating layer 23 for exposure and development to form openings reaching the first wiring. Moreover, Ti and Cu are deposited over throughout the surface to form the seed layer 28 to pattern the resist film for the opening for the second wiring forming area. By the electrolytic plating process in which the seed layer 28 is one of electrodes, the copper layer 29 is formed to remove the resist film. Since the seed layer 28 is also used in the electrolytic plating process step of forming the conductive post in the subsequent process step, it is not etched.

Figure 8B:
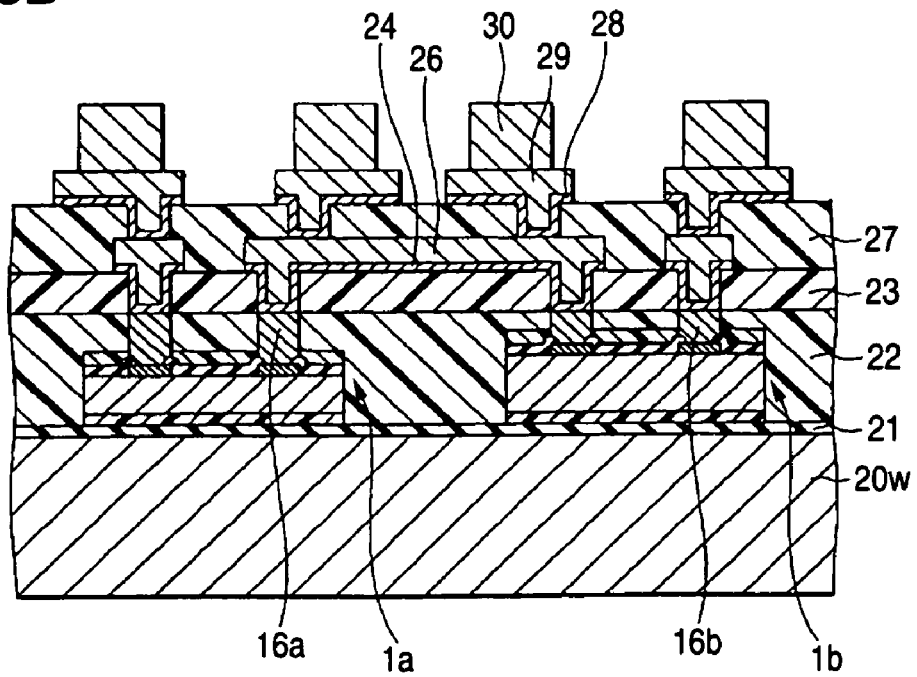

Subsequently, as shown in FIG. 8B, for example, by the photolithography process step, the resist film is patterned in the pattern to form the opening for the forming area of the conductive post. Moreover, by the electrolytic plating process in which the seed layer 28 is one of electrodes, the conductive post 30 formed of copper is formed so as to connect to the second wiring. The diameter of the conductive post formed of copper is 180 μm, and the height is 80 μm.

After that, the resist film is removed, the conductive post 30 and the copper layer 29 are used as masks for wet etching, and the seed layer 28 is removed between the copper layers 29.

As described above, by repeating the process steps, the insulating layer can be formed in which the first insulating layer and the second insulating are laminated or more resin layers are laminated. In addition, the wiring having the first wiring and the second wiring or more wirings laminated can be laminated as it is buried in the insulating layer.

Figure 9A:
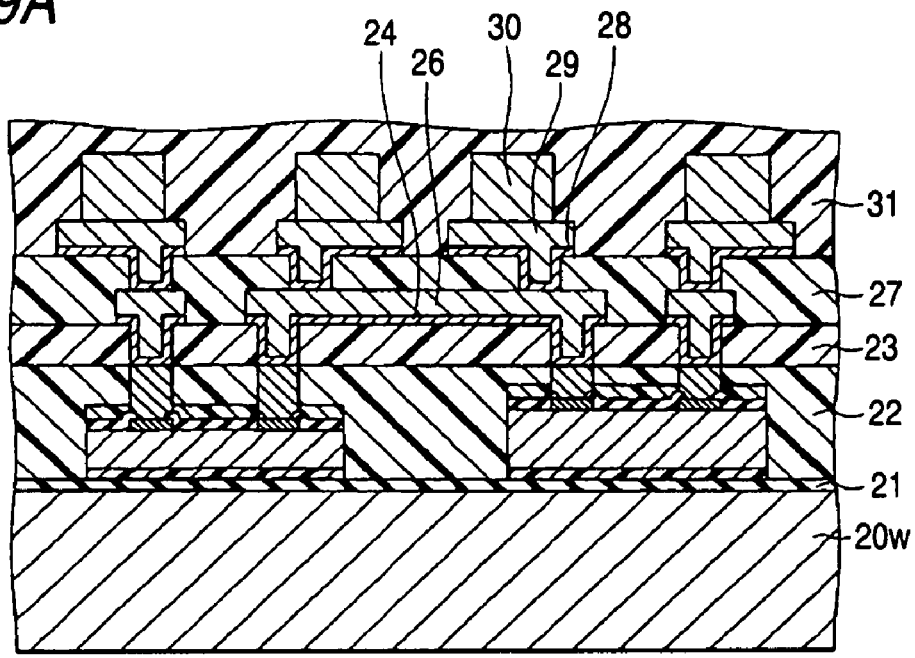
FIGS. 9A and 9B show cross sections depicting the fabrication process steps of the fabrication method of the semiconductor device according to the first embodiment of the invention.

Subsequently, as shown in FIG. 9A, above the third insulating layer 27 around the conductive post 30, the insulating buffer layer 31 is formed by printing or molding, for example, which is formed of a resin such as epoxies, polyimides and silicons and relaxes the stress generated when the semiconductor device is mounted on the substrate.

In the case of a polyimide resin, the buffer layer is formed by printing in which a paste having an NV value of 27.5 is used for printing with a squeegee. For curing, heat treatment is conducted for a time period of (100° C. for 10 minutes)+(150° C. for 10 minutes)+(200° C. for 10 minutes)+(250° C., 60 minutes).

Figure 9B:
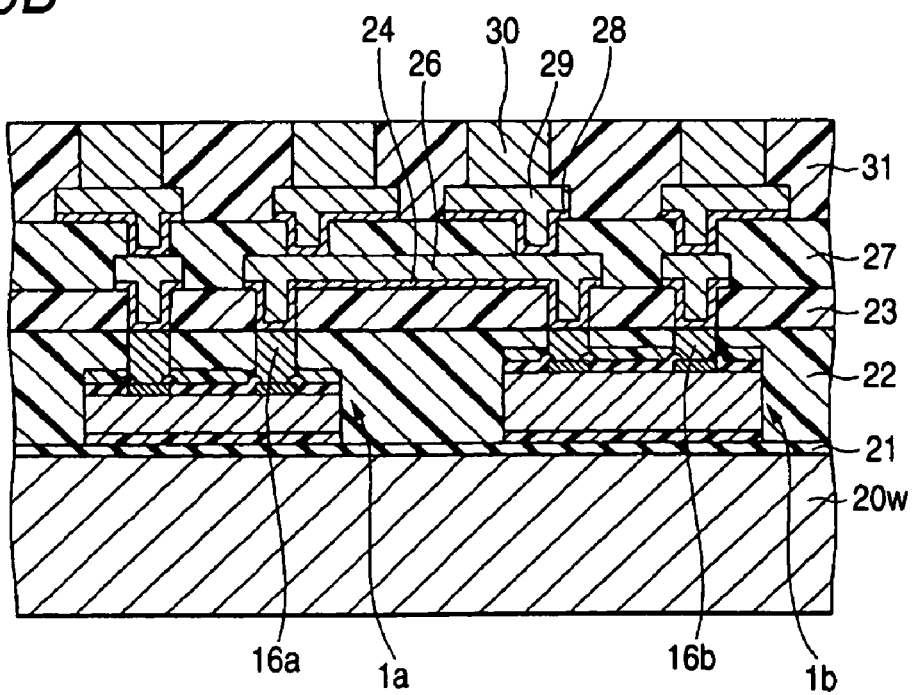

Subsequently, as shown in FIG. 9B, the buffer layer 31 is polished from the top surface, for example, to expose the top of the conductive post 30. For example, the condition is a time period of 3500 rpm for 0.5 mm/sec. with a #600 wheel.

As described above, after thus polished, the shape of the top surface rim of the buffer layer 38 remains in the shape as described above.

Figure 10A:
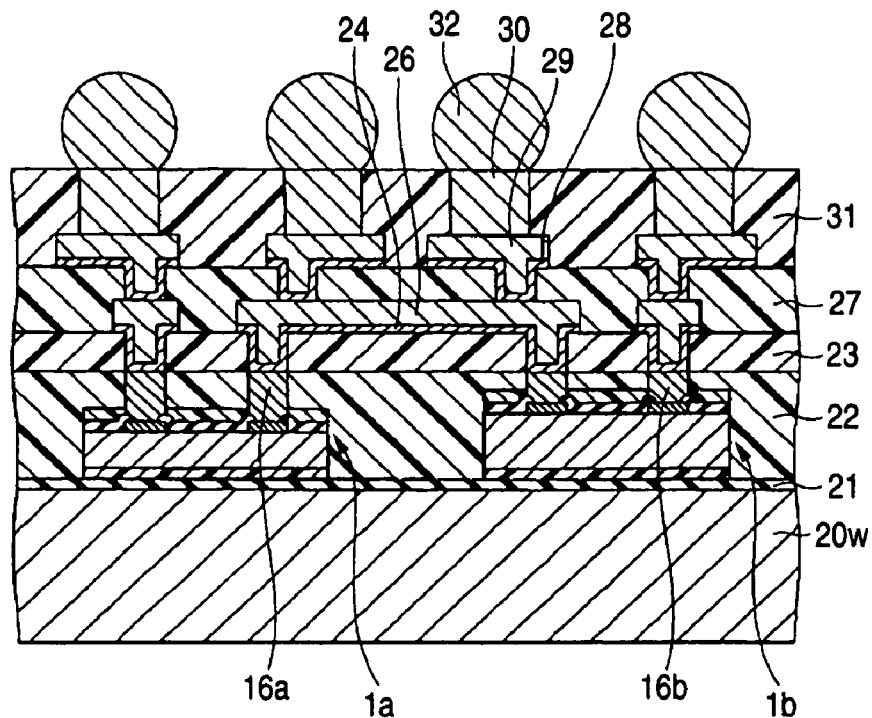
FIGS. 10A and 10B show cross sections depicting the fabrication process steps of the fabrication method of the semiconductor device according to the first embodiment of the invention.

Subsequently, as shown in FIG. 10A, for example, the bump (the projected electrode) 32 is formed on the exposed conductive post with a solder ball or solder paste.

Figure 10B:
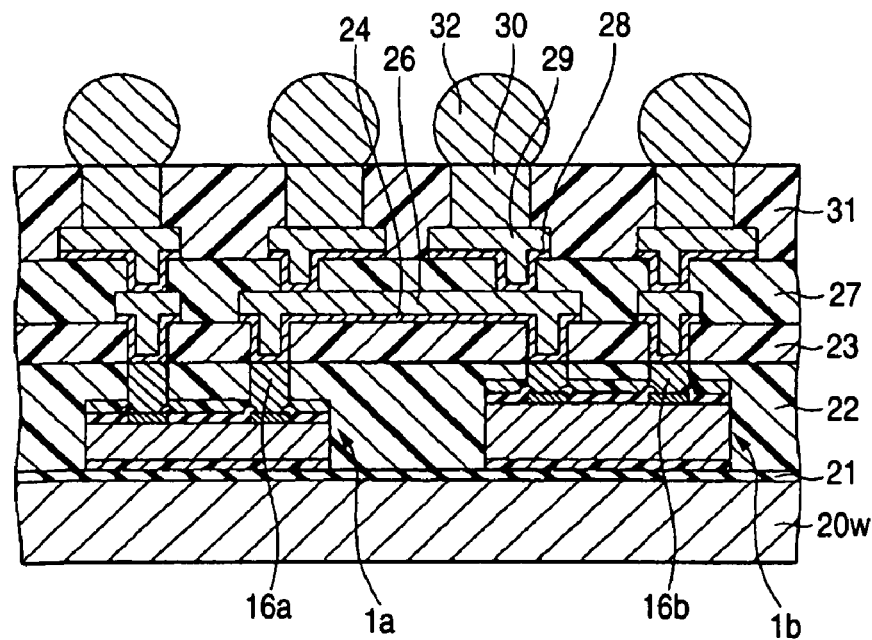

Subsequently, as shown in FIG. 10B, the wafer is ground to reduce the thickness from the back side of the substrate 20w, and then it is diced at dicing lines, whereby the semiconductor device having the configuration as shown in FIG. 1 can be fabricated.

In the semiconductor device, in the case in which the semiconductor chip built therein is reduced in the thickness, when the substrate is also reduced in the thickness, the total thickness of the overall semiconductor device can be reduced down to the thickness of 725 μm. When the thickness is further reduced, the mounted semiconductor chip is ground more. In the case of LGA, it is the structure in which the thickness is reduced down to the total thickness of 250 μm.

In accordance with the fabrication method of the semiconductor device according to the embodiment, in the fabrication method of the semiconductor device of the SiP form in which the semiconductor chip is buried in the insulating film, the insulating layer in which the semiconductor chip is buried is polished to expose the projected electrode. Therefore, the pad electrode of the semiconductor chip can be made fine not by the photolithography process step and connected to the upper wiring layer.

Second Embodiment

Figure 11:
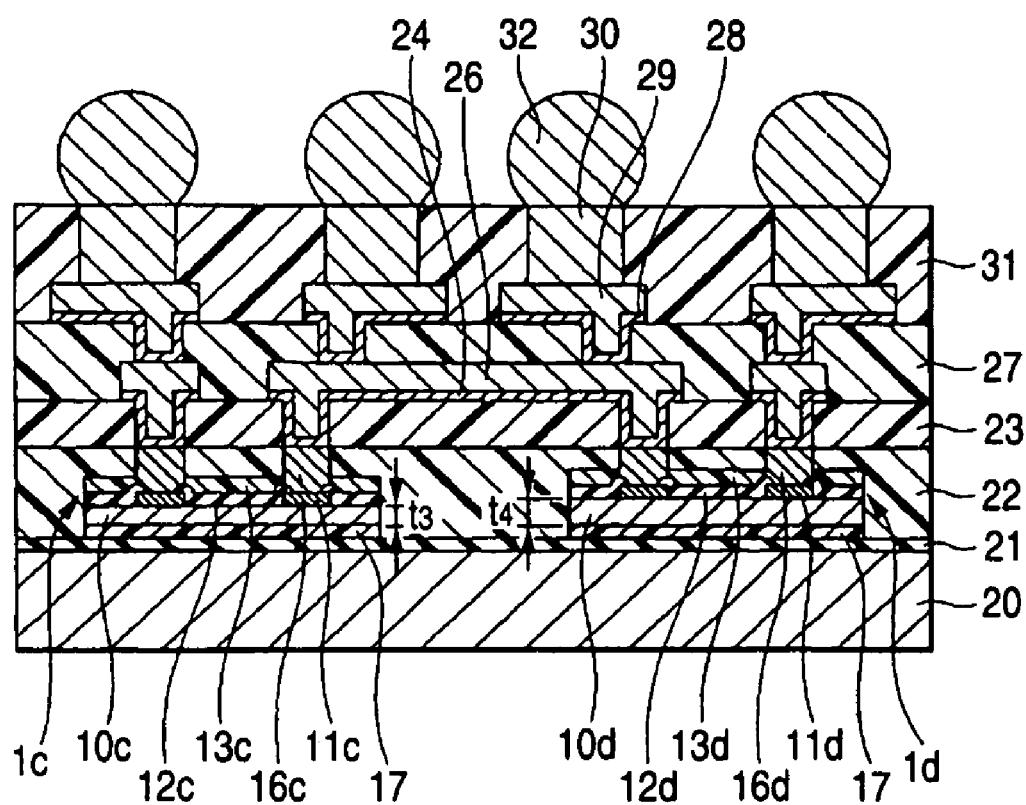
FIG. 11 shows a schematic cross section depicting a semiconductor device according to a second embodiment of the invention.

FIG. 11 shows a schematic cross section depicting a semiconductor device according to the embodiment.

It is basically the same as the semiconductor device according to the first embodiment. As similar to the first embodiment, in the configuration of semiconductor chips (1c and 1d) to be buried in an insulating layer, pad electrodes (11c and 11d) are formed on the surfaces of semiconductor main bodies (10c and 10d). Protective insulating films (12c and 12d) are formed so as to form openings for the pad electrodes (11c and 11d). Above the protective insulating films (12c and 12d), resin insulating films (13c and 13d) to form openings for the pad electrodes (11c and 11d) are formed in the pattern the same as the pattern of the protective insulating films (12c and 12d). In the openings formed in the protective insulating films (12c and 12d) and the resin insulating films (13c and 13d), bumps (projected electrodes 16c and 16d) are formed at a predetermined height which are connected to the pad electrodes (11c and 11d). A seed layer is omitted in the drawing which is formed on the interface between the pad electrodes (11c and 11d) and the projected electrodes (16c and 16d).

Here, the thicknesses ($t_3$ and $t_4$) of the semiconductor main bodies (10c and 10d) of the semiconductor chips (1c and 1d) are reduced in the thickness down to a few 10 μm. Although $t_3$ and $t_4$ are varied from each other, but the difference is set to within 10 μm, for example.

The semiconductor device according to the embodiment has the configuration in which the insulating layer to bury the semiconductor chip therein is polished to expose the bumps (projected electrodes) in the semiconductor device of the SiP form in which the semiconductor chip is buried in the insulating film. It is the semiconductor device in which the pad electrode of the semiconductor chip can be made fine not by the photolithography process step, and connected to the upper wiring layer.

Next, a fabrication method of the semiconductor device according to the embodiment will be described in FIGS. 12A to 12C.

The semiconductor chips (1c and 1d) to be buried in the insulating layer can be formed as similar to the first embodiment.

However, the chip is ground from the back side at the wafer level, and the thicknesses ($t_3$ and $t_4$) are each reduced down to a few 10 μm.

Figure 12A:
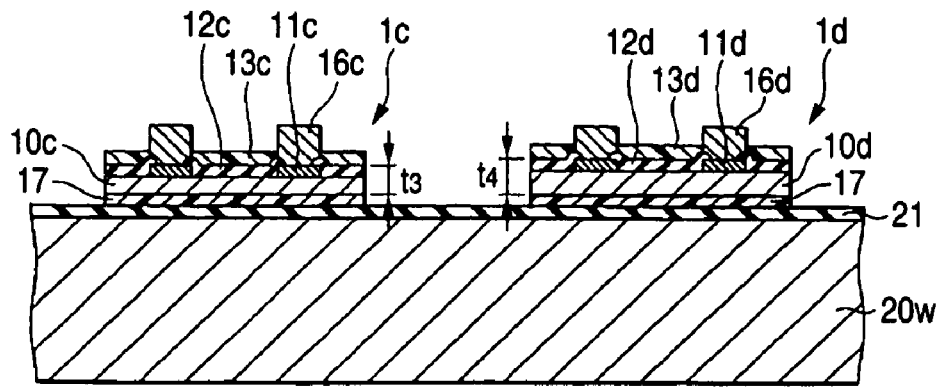
FIGS. 12A to 12C show cross sections depicting the fabrication process steps of a fabrication method of the semiconductor device according to the second embodiment of the invention.

Subsequently, as shown in FIG. 12A, on a substrate 20w in a wafer on the surface of which an insulating film 21 such as silicon oxide is formed, an alignment mark preformed on the substrate 20w is recognized to mount two semiconductor chips (1c and 1d) thus formed face up by thermocompression bonding with a die attach film 17.

Figure 12B:
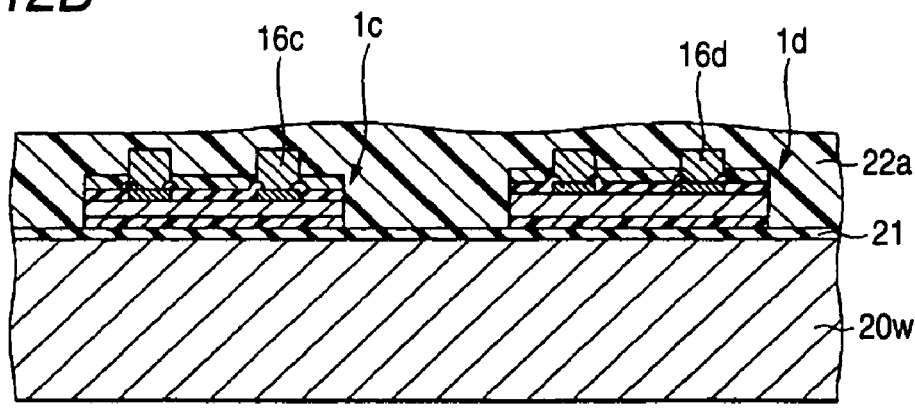

Subsequently, as shown in FIG. 12B, for example, a non-photosensitive resin material, or a photosensitive resin material of epoxies, acrylics, phenols and polyimides is coated over and throughout the surfaces of the semiconductor chips (1c and 1d) by printing or molding, and a first insulating layer 22a is formed.

Figure 12C:
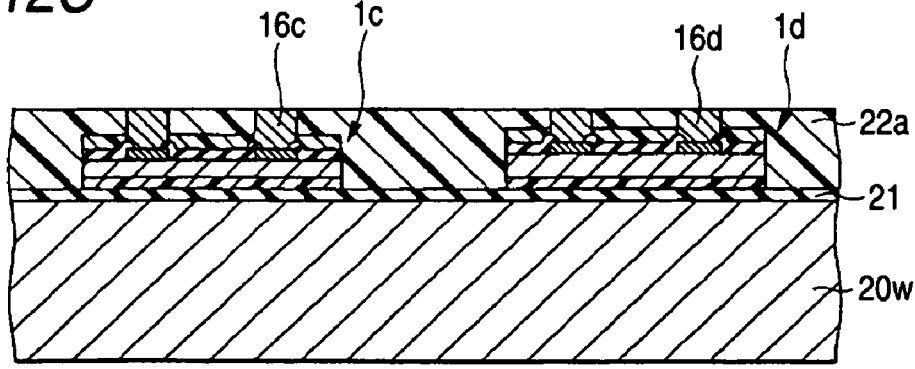

Subsequently, as shown in FIG. 12C, the first insulating layer 22a is polished from the top surface until the tops of the bumps (16c and 16d) are exposed, for example.

For example, the polishing condition is the number of revolutions of a spindle of 3500 rpm with a #600 wheel.

The process steps after this can be conducted as similar to those of the first embodiment.

In accordance with the fabrication method of the semiconductor device according to the embodiment, in the fabrication method of the semiconductor device of the SiP form in which the semiconductor chip is buried in the insulating film, the insulating layer to bury the semiconductor chip therein is polished to expose the projected electrode. By the method, the pad electrode of the semiconductor chip can be made fine not by the photolithography process step, and connected to the upper wiring layer.

Here, since the semiconductor chips (1c and 1d) are reduced in the thickness down to about 10 μm, even though the photosensitive resin material is coated for a single coating, the first insulating layer can be formed with no problem. Actually, no rays are applied onto the first insulating layer, and the tops of the bumps are exposed by polishing. Therefore, as similar to the first embodiment, the first insulating layer may be formed with a non-photosensitive resin material.

Third Embodiment

Figure 13:
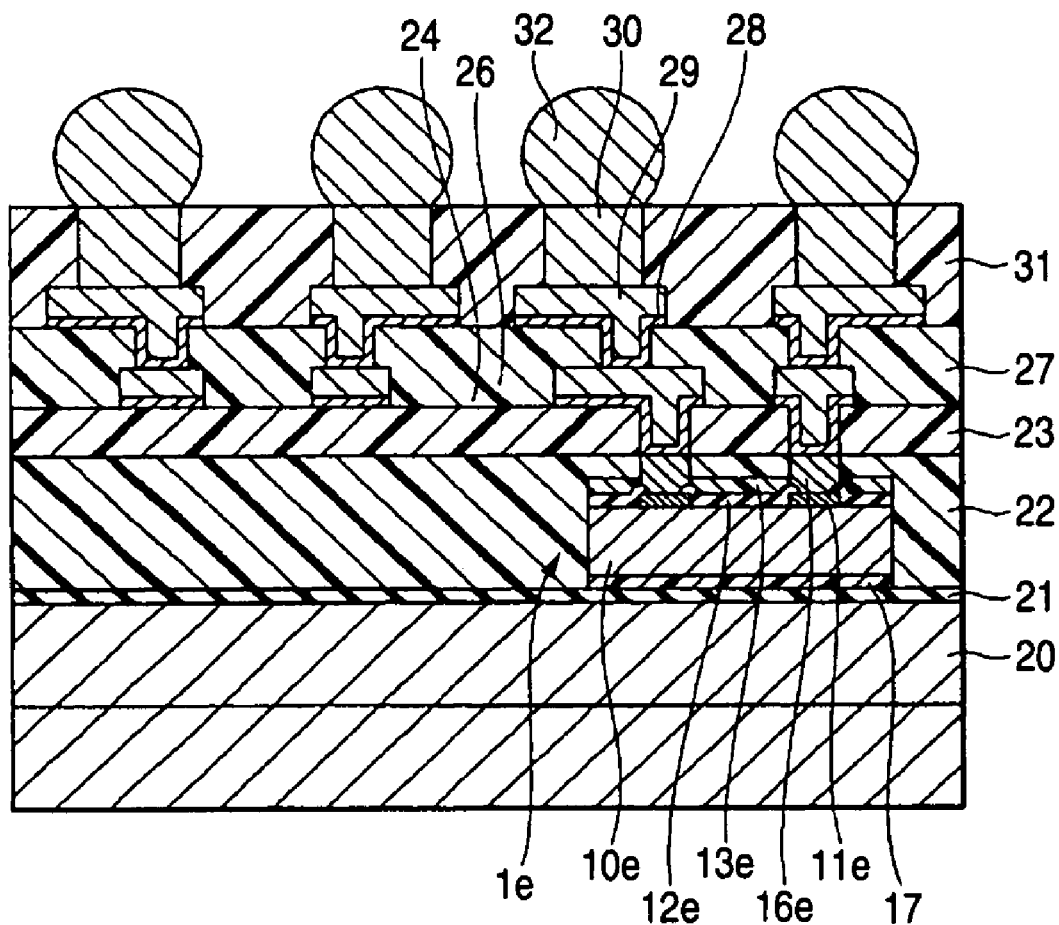
FIG. 13 shows a schematic cross section depicting a semiconductor device according to a third embodiment of the invention.

FIG. 13 shows a schematic cross section depicting a semiconductor device according to the embodiment.

It is basically the same as the semiconductor device according to the first embodiment. It is different from the first embodiment in that a single semiconductor chip 1e is buried in an insulating layer. As similar to the first embodiment, in the configuration of the semiconductor chip 1e, a pad electrode 11e is formed on the surface of a semiconductor main body 10e. A protective insulating film 12e is formed so as to form an opening for a pad electrode 11e. Above the protective insulating film 12e, a resin insulating film 13e to form an opening for the pad electrode 11e is formed in the pattern the same as the pattern of the protective insulating film 12e. In the opening formed in the protective insulating film 12e and the resin insulating film 13e, a bump (projected electrode 16e) is formed at a predetermined height which is connected to the pad electrode 11e. A seed layer is omitted in the drawing which is formed on the interface between the pad electrode 11e and the bump 16e.

The semiconductor device according to the embodiment is basically the same as that of the first embodiment other than the descriptions above.

For example, the thickness of the semiconductor main body 10e of the semiconductor chip 1e is reduced down to about a few 100 μm, or a few 10 μm.

The semiconductor device according to the embodiment has the configuration in which the insulating layer to bury the semiconductor chip therein is polished to expose the bump (the projected electrode) in the semiconductor device of the SiP form in which the semiconductor chip is buried in the insulating film. It is the semiconductor device in which the pad electrode of the semiconductor chip can be made fine not by the photolithography process step and connected to the upper wiring layer.

A fabrication method of the semiconductor device according to the embodiment can be conducted as similar to the first embodiment by establishing a single semiconductor chip to be mounted.

In accordance with the fabrication method of the semiconductor device according to the embodiment, in the fabrication method of the semiconductor device of the SiP form in which the semiconductor chip is buried in the insulating film, the insulating layer to bury the semiconductor chip therein is polished to expose the projected electrode. By this method, the pad electrode of the semiconductor chip can be made fine not by the photolithography process step and connected to the upper wiring layer.

In accordance with the semiconductor device and the fabrication method thereof according to the embodiments, the following advantages can be exerted.

(1) The chip buried wafer level SiP can be implemented with no reduction in the thickness of a semiconductor chip to be buried.

(2) It is unnecessary to use an expensive photosensitive resin for a resin for burying, and an inexpensive non-photosensitive resin can be adopted.

(3) Even though the thickness of a semiconductor chip to be buried is thick, the device and the method can cope with the reduction in the thickness with no increase in the total thickness of SiP. For example, according to the electrical characteristic test, wafers in a thickness of 400 μm are supplied in the market. Some of semiconductor wafers and chips have a thickness of about 400 μm, and are distributed on the market in the form of the wafer or the chip. Even in the case in which a chip obtained from the semiconductor chip or the semiconductor wafer is adopted to SiP, the chip can be used as it is.

The embodiments of the invention are not limited to the discussion above.

For example, an electronic circuit may be formed on a substrate. In this case, the wiring to be buried in the insulating layer may be formed so as to connect to the substrate.

For the material for the resin insulating layer to bury the semiconductor chip, a non-photosensitive resin material may be used as described above, but a photosensitive resin material may be used.

In addition to this, various modifications can be made within the scope not deviating from the teachings of the embodiments of the invention.

The semiconductor device according to an embodiment of the invention can be adapted to the semiconductor device in the form of System in Package.

In addition, the fabrication method of a semiconductor device according to an embodiment of the invention can be adapted to a fabrication method of a semiconductor device in the form of System in Package.

It should be understood by those skilled in the art that various modifications combinations, sub combinations and alterations may occur depending on design requirements and other factors insofar as they are within the scope of the appended claims or the equivalents thereof.

What is claimed:

1. A fabrication method of a semiconductor device, the method comprising the steps of:
   forming an opening in a resin insulating layer, said opening in the resin insulating layer exposing a pad electrode;
   depositing a seed layer onto said resin insulating layer and said pad electrode, said seed layer covering an inner wall surface of said opening in the resin insulating layer;
   forming a resist film on said seed layer, an opening in the resist film being in alignment with said opening in the resin insulating layer.

2. The fabrication method of the semiconductor device according to claim 1, wherein said resin insulating layer is a photosensitive resin.

3. The fabrication method of the semiconductor device according to claim 1, wherein in the step of depositing the seed layer, said seed layer onto said resin insulating layer by sputtering.

4. The fabrication method of the semiconductor device according to claim 1, further comprising the step of:
   forming a bump within said opening in the resist film and said opening in the resin insulating layer.

5. The fabrication method of the semiconductor device according to claim 4, wherein said bump is copper.

6. The fabrication method of the semiconductor device according to claim 4, wherein said bump is formed by an electrolytic plating process with said seed layer being one of the electrodes.

7. The fabrication method of the semiconductor device according to claim 4, further comprising the step of:
   removing said resist film and a portion of the seed layer to expose said resin insulating layer, said seed layer covering said inner wall surface being masked by said bump.

8. The fabrication method of the semiconductor device according to claim 7, further comprising the step of:

bonding a semiconductor main body onto a substrate, said pad electrode being on said semiconductor main body.

9. The fabrication method of the semiconductor device according to claim 8, wherein another semiconductor main body is bonded onto said substrate, a thickness of said semiconductor main body differing from a thickness of said another semiconductor main body.

10. The fabrication method of the semiconductor device according to claim 8, wherein an electronic circuit in said semiconductor main body is connected to said pad electrode.

11. The fabrication method of the semiconductor device according to claim 7, further comprising the step of:

covering said bump and said resin insulating layer with an insulating layer.

12. The fabrication method of the semiconductor device according to claim 11, wherein said first insulating layer is a non-photosensitive resin material.

13. The fabrication method of the semiconductor device according to claim 11, further comprising the step of:

polishing said first insulating layer to expose said bump.

14. The fabrication method of the semiconductor device according to claim 13, further comprising the step of:

forming a second insulating layer on said bump and said first insulating layer, said second insulating layer being a photosensitive resin.

* * * * *